(12) United States Patent
Chung et al.

(10) Patent No.: US 8,945,406 B2
(45) Date of Patent: Feb. 3, 2015

(54) ELECTRONIC DEVICE, AND METHOD FOR MANUFACTURING SYMBOL ON EXTERIOR OF ELECTRONIC DEVICE

(75) Inventors: Seong-eun Chung, Seoul (KR); Il-yong Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 13/604,698

(22) Filed: Sep. 6, 2012

(65) Prior Publication Data

US 2013/0056437 A1 Mar. 7, 2013

(30) Foreign Application Priority Data

Sep. 6, 2011 (KR) .......................... 10-2011-0090326

(51) Int. Cl.
*B82Y 40/00* (2011.01)
*G03F 7/20* (2006.01)

(52) U.S. Cl.
CPC ............... *G03F 7/20* (2013.01); *Y10S 977/834* (2013.01); *Y10S 977/888* (2013.01)
USPC .................. 216/24; 216/28; 216/32; 216/41; 216/49; 216/58; 216/67; 216/83; 216/96; 216/100; 204/192.34; 977/834; 977/888

(58) Field of Classification Search
None
See application file for complete search history.

(56) References Cited

U.S. PATENT DOCUMENTS

| | | | | |
|---|---|---|---|---|
| 8,659,221 | B2* | 2/2014 | Jones et al. | 313/506 |
| 2005/0167857 | A1* | 8/2005 | Iwase et al. | 257/797 |
| 2005/0170657 | A1* | 8/2005 | Khang et al. | 438/706 |
| 2008/0291815 | A1* | 11/2008 | Edwards | 369/283 |
| 2009/0087994 | A1* | 4/2009 | Lee et al. | 438/704 |
| 2011/0164252 | A1* | 7/2011 | Handa et al. | 356/445 |
| 2012/0055902 | A1* | 3/2012 | Park et al. | 216/41 |
| 2012/0063478 | A1* | 3/2012 | Park | 372/39 |
| 2013/0070459 | A1* | 3/2013 | Kim et al. | 362/259 |

* cited by examiner

*Primary Examiner* — Anita Alanko
(74) *Attorney, Agent, or Firm* — Sughrue Mion, PLLC (57) ABSTRACT

A method for manufacturing a symbol on an exterior of an electronic device is provided. The method includes preparing a support layer, preparing a nanograting layer on the support layer, the nanograting layer including a first nanograting area corresponding to a preset symbol and a second nanograting area corresponding to an area other than the preset symbol, wherein each of the first nanograting area and the second nanograting area includes three-dimensional (3D) nanostructures and a pitch between the 3D nanostructures arranged in the first nanograting area is different from a pitch between the 3D nanostructures arranged in the second nanograting area.

7 Claims, 8 Drawing Sheets

ELECTRONIC DEVICE, AND METHOD FOR MANUFACTURING SYMBOL ON EXTERIOR OF ELECTRONIC DEVICE

CROSS-REFERENCE TO RELATED APPLICATIONS

This application claims priority from Korean Patent Application No. 2011-0090326, filed Sep. 6, 2011, in the Korean Intellectual Property Office, the disclosures of which are incorporated herein by reference in their entirety.

BACKGROUND

1. Field

Methods and apparatuses consistent with exemplary embodiments herein relate to an electronic device and a method for manufacturing a symbol on an exterior of the electronic device, and more particularly, to an electronic device which uses metamaterials, and a method for manufacturing a symbol on an exterior of the electronic device.

2. Description of the Related Art

Conventionally, organic dyes are used in manufacturing a design or mark on an exterior of an electronic device.

However, it is difficult to represent various colors other than white (for example, blue, yellow, or the like), if a design or mark is manufactured using organic dyes.

Additionally, it is difficult to express different colors for each character, and it is impossible to express a special technique, such as color gradation.

Accordingly, there is a need for a new method for manufacturing a design or mark on an exterior of an electronic device.

SUMMARY

An aspect of the exemplary embodiments relates to an electronic device which uses metamaterials representing colors based on a Surface Plasmon Resonance (SPR) phenomenon, and a method for manufacturing a symbol on an exterior of the electronic device.

A method for manufacturing a symbol on an exterior of an electronic device, according to an exemplary embodiment, includes preparing a support layer and preparing a nanograting layer on the support layer. The nanograting layer includes a first nanograting area corresponding to a preset symbol and a second nanograting area corresponding to an area other than the preset symbol, wherein each of the first nanograting area and the second nanograting area includes three-dimensional (3D) nanostructures and a pitch between the 3D nanostructures arranged in the first nanograting area is different from a pitch between the 3D nanostructures arranged in the second nanograting area.

The first nanograting area may include slit-shaped 3D nanostructures arranged at a first pitch and the second nanograting area may include slit-shaped 3D nanostructures arranged at a second pitch which is different from the first pitch.

The first nanograting area may include bar-shaped 3D nanostructures arranged at a first pitch and the second nanograting area may include bar-shaped 3D nanostructures arranged at a second pitch which is different from the first pitch.

The first nanograting area and the second nanograting area may represent different colors using a Surface Plasmon Resonance (SPR) phenomenon caused by the different pitches.

An electronic device according to an exemplary embodiment includes a symbol manufactured on an exterior of the electronic device. The symbol may include a support layer and a nanograting layer which is formed on the support layer. The nanograting layer includes a first nanograting area corresponding to a preset symbol and a second nanograting area corresponding to an area other than the preset symbol. Each of the first nanograting area and the second nanograting area may include 3D nanostructures and a pitch between the 3D nanostructures arranged in the first nanograting area may be different from a pitch between the 3D nanostructures arranged in the second nanograting area.

The first nanograting area may include slit-shaped 3D nanostructures arranged at a first pitch, and the second nanograting area may include slit-shaped 3D nanostructures arranged at a second pitch which is different from the first pitch.

The first nanograting area may include bar-shaped 3D nanostructures arranged at a first pitch, and the second nanograting area may include bar-shaped 3D nanostructures arranged at a second pitch which is different from the first pitch.

The first nanograting area and the second nanograting area may represent different colors using an SPR phenomenon caused by the different pitches.

Accordingly, it is possible to manufacture a symbol (for example, a design or mark) representing permanent colors, without using a method such as special printing, and the like.

BRIEF DESCRIPTION OF THE DRAWINGS

The above and/or other aspects of the present disclosure will be more apparent by describing certain present disclosure with reference to the accompanying drawings, in which.

DETAILED DESCRIPTION

Certain exemplary embodiments are described in detail below with reference to the accompanying drawings.

In the following description, like drawing reference numerals are used to denote like elements throughout the drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

Figure 1:
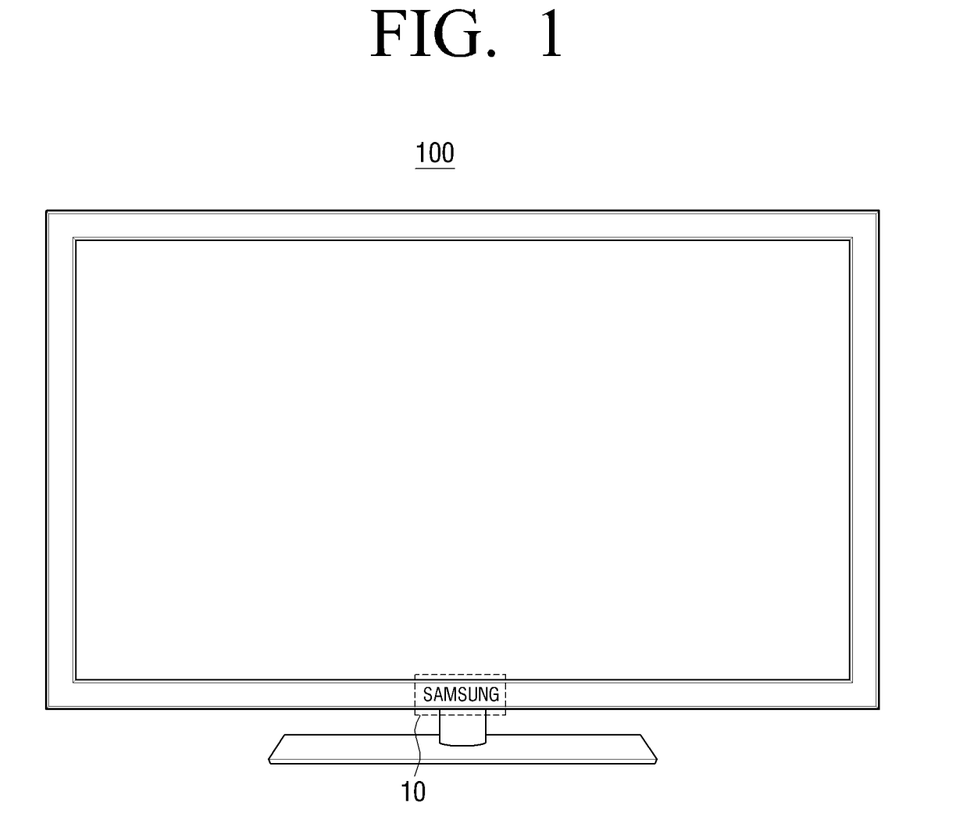
FIG. 1 is a view to explain a configuration of a symbol on an exterior of an electronic device according to an exemplary embodiment.

FIG. 1 is a view to explain a configuration of a symbol 10 on an exterior of an electronic device 100 according to an exemplary embodiment.

A symbol manufacturing method according to an exemplary embodiment may be applied to manufacturing of the symbol 10 of the electronic device 100 of FIG. 1.

FIG. 1 illustrates a TV as the electronic device 100, but there is no limitation thereto. For example, the electronic device 100 may include home appliances such as a monitor or a refrigerator. The electronic device 100 may also include a portable terminal such as a mobile phone, a Portable Multimedia Player (PMP), a netbook, a notebook computer, an electronic book (e-book), a display device for displaying and advertising, and the like. In other words, various devices to which a mark or design is applicable may be used as the electronic device 100.

The symbol manufacturing method may be performed based on a phenomenon caused by a plasmon in which free electrons in a metal collectively oscillate. When a size of the metal is reduced to nanoscale, plasmon resonance properties may appear on a surface of the metal due to the oscillation of free electrons. A Surface Plasmon Resonance (SPR) refers to a collective charge density oscillation occurring on a surface of a metallic thin film, and a Surface Plasmon Wave (SPW) generated by the oscillation is a surface electromagnetic wave propagating along a boundary surface between a metal and a dielectric material. The SPW may be generated due to an occurrence of a surface wave, rather than a light of a predetermined wavelength incident to a surface of a metal being completely reflected.

The SPR phenomenon may occur in metals which enable electrons to be easily emitted due to an external stimulus, and which have negative dielectric constants. The metals may include, for example, gold (Au), silver (Ag), copper (Cu), aluminum (Al), and the like.

Using the SPR phenomenon, various colors may express a symbol manufactured on an exterior of an electronic device. For example, the symbol may include a text, a design, a mark, and the like.

Figure 2A:
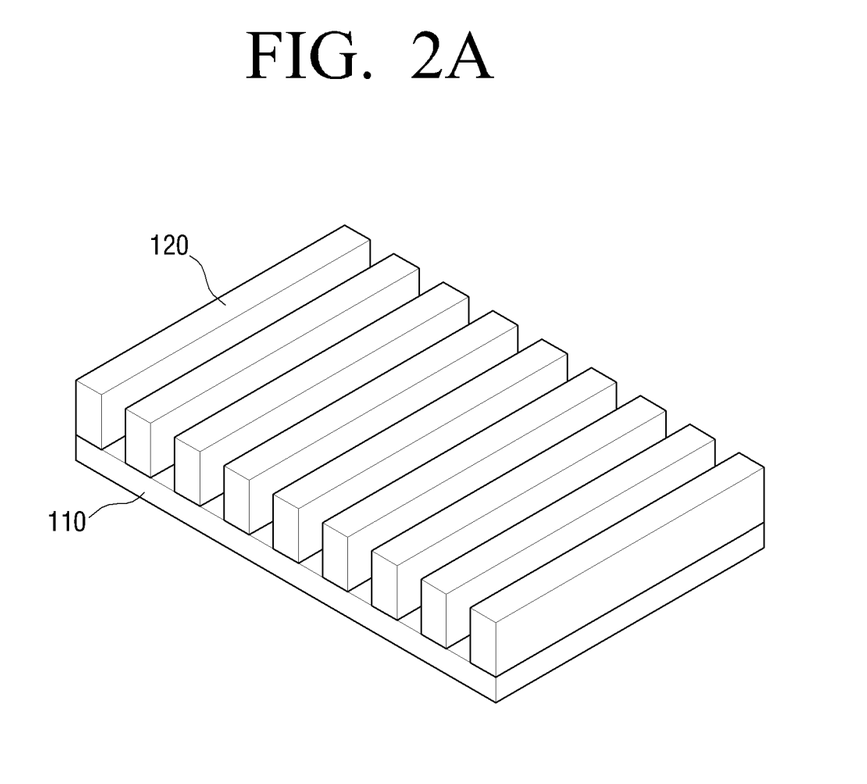
FIGS. 2A and 2B are views to explain a configuration of a nanograting layer according to various exemplary embodiments.
Figure 2B:
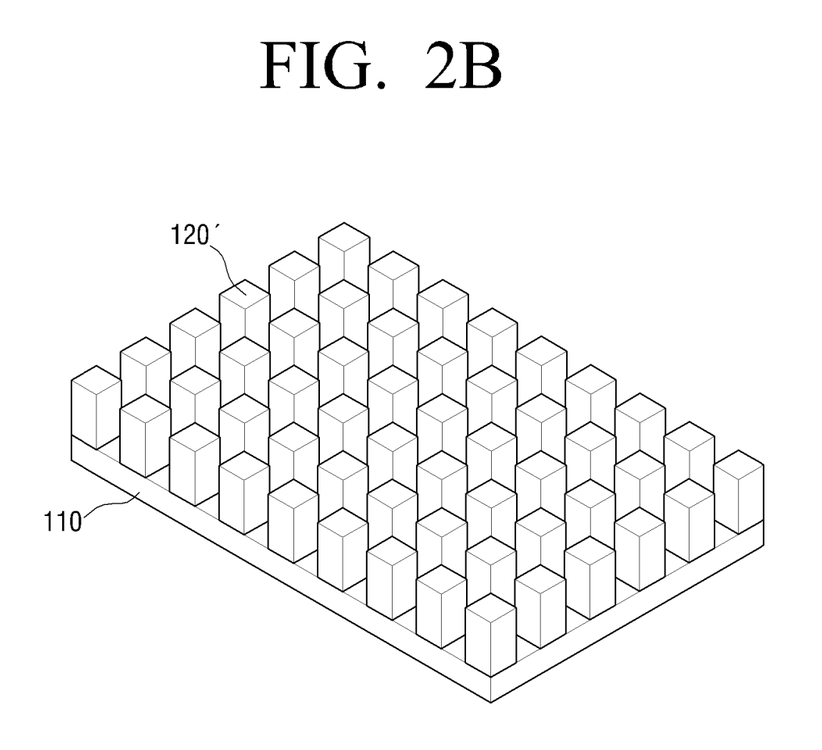

FIGS. 2A and 2B are views to explain a configuration of a nanograting layer according to various exemplary embodiments.

If a pitch between three-dimensional (3D) nanostructures forming a nanograting area of FIG. 2A is different from a pitch of 3D nanostructures forming a nanograting area of FIG. 2B, the nanograting areas may represent different colors due to the SPR phenomenon.

As shown in FIG. 2A, a nanograting layer 120 may include slit-shaped 3D nanostructures which are arranged in a predetermined direction on a support layer 110.

Specifically, the slit-shaped 3D nanostructures may each have a predetermined height and a predetermined width, and may be arranged at a predetermined interval, namely a pitch. The pitch between the slit-shaped 3D nanostructures may be adjusted based on colors of light to be emitted.

As shown in FIG. 2B, a nanograting layer 120' may include bar-shaped 3D nanostructures which are arranged in a predetermined direction on a support layer 110.

Specifically, the bar-shaped 3D nanostructures may each have a predetermined height, a predetermined width, and may be arranged at a predetermined interval, namely a pitch. The pitch between the bar-shaped 3D nanostructures may also be adjusted based on colors of light to be emitted.

According to an aspect of an exemplary embodiment, a nanograting layer may also include groove-shaped 3D nanostructures which are arranged in a predetermined direction on a support layer 110. The distance interval between the groove shaped nanostructures may be adjusted to emit different colors of light.

Specifically, the bar-shaped 3D nanostructures may each have a predetermined height, a predetermined width, and may be arranged at a predetermined interval, namely a pitch. The pitch between the bar-shaped 3D nanostructures may also be adjusted based on colors of light to be emitted.

Figure 3A:
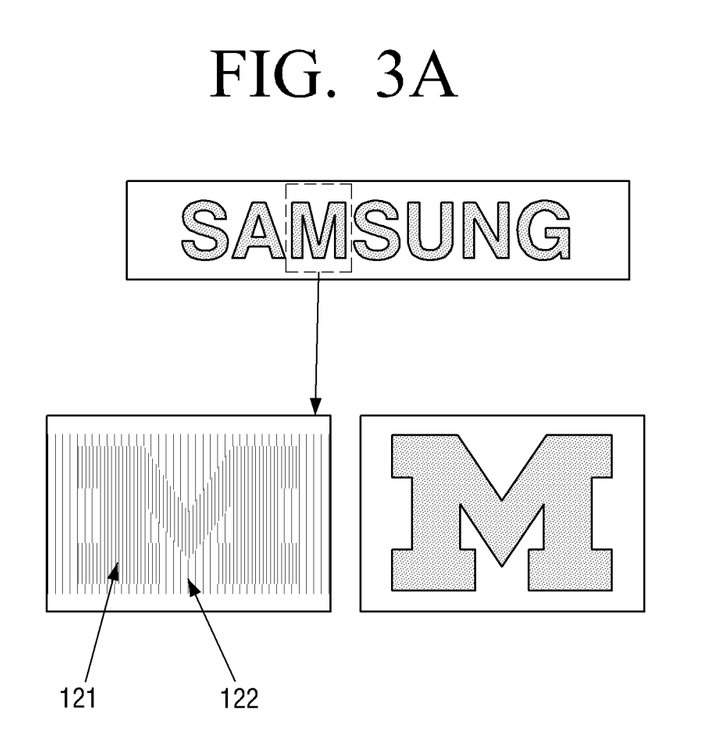
FIGS. 3A and 3B are views to explain a form of a symbol according to an exemplary embodiment.
Figure 3B:
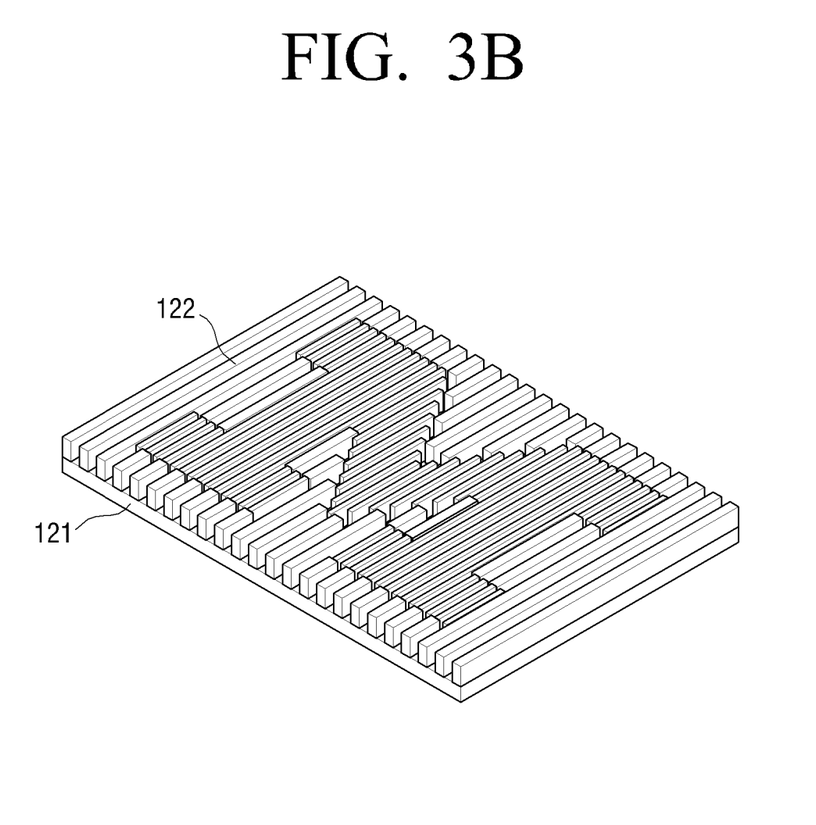

FIGS. 3A and 3B are views to explain a form of a symbol according to an exemplary embodiment.

For example, a mark "SAMSUNG" of FIG. 3A may be manufactured on an electronic device.

To manufacture a character "M" of the mark "SAMSUNG", a first nanograting area 121 corresponding to the character "M" may be formed so that 3D nanostructures of the first nanograting area 121 may be arranged at a first pitch. Additionally, a second nanograting area 122 corresponding to an area other than the character "M" may be formed so that 3D nanostructures of the second nanograting area 122 may be arranged at a second pitch which is different from the first pitch.

FIG. 3B shows the character "M" in 3D.

In FIG. 3B, a nanograting layer may be formed on a support layer, to display a design or mark. The nanograting layer may include the first nanograting area 121 corresponding to the character "M", and the second nanograting area 122 corresponding to the area other than the character "M". Here, the first pitch and the second pitch may be different from each other. Additionally, the first nanograting area 121 and the second nanograting area 122 may be formed of metals, such as Al, Ag, and the like, but is not limited thereto.

Specifically, the first nanograting area 121 may include slit-shaped 3D nanostructures arranged at the first pitch, and the second nanograting area 122 may include slit-shaped 3D nanostructures arranged at the second pitch. Since the first pitch and the second pitch are different from each other, the character "M" and the other area may be expressed by different colors respectively corresponding to the different pitches, according to SPR properties.

Additionally, the first pitch and the second pitch may be different from each other, so that an incident light may be emitted as light with different colors. For example, the 3D nanostructures of the first nanograting area 121 may be arranged at a pitch of 310 nanometers (nm), and the 3D nanostructures of the second nanograting area 122 may be arranged at a pitch of 220 nm.

Furthermore, the first pitch may be greater than or less than the second pitch.

Accordingly, due to the SPR phenomenon, the first nanograting area 121 and the second nanograting area 122 may represent different colors.

As described above, the first nanograting area 121 includes the slit-shaped 3D nanostructures arranged at the first pitch, and the second nanograting area 122 includes the slit-shaped 3D nanostructures arranged at the second pitch. However, the shape of the 3D nanostructures is not limited thereto.

In other words, the 3D nanostructures may be in the form of bars, instead of slits. In this case, the first pitch and the second pitch may also be different from each other.

Furthermore, if an interval of a nanograting layer is changed depending on a design, a reflective color design may be created.

FIGS. 4A through 4D are cross-sectional views to explain a process of fabricating a nanograting layer according to an exemplary embodiment.

Figure 4A:
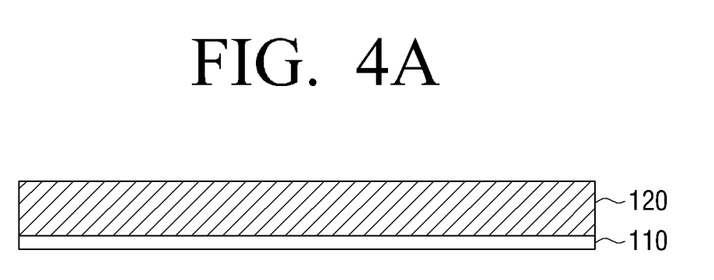
FIGS. 4A through 4D are cross-sectional views to explain a process of fabricating a nanograting layer according to an exemplary embodiment.

To form a nanograting layer 120 on a support layer 110, the nanograting layer 120 is laminated on the support layer 110, as shown in FIG. 4A. Here, a sputtering method may be used.

Figure 4B:
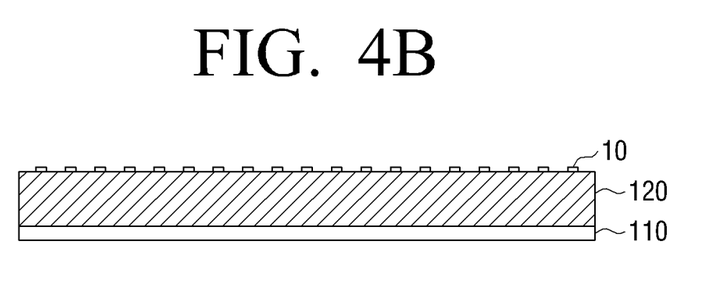

FIG. 4B shows a state in which the nanograting layer 120 is covered with a mask 10 in which a pattern is formed, in order to etch the nanograting layer 120 to form 3D nanostructures.

Hereinafter, an etching process for etching the nanograting layer 120 to form 3D nanostructures is described.

The etching process is broadly classified into wet etching and dry etching depending on method. The wet etching may enable an exposed portion in which there is no PR pattern to be melted using acidic chemicals which corrode metals. The dry etching may enable a pattern to be formed by removing materials from an exposed portion by accelerating ions.

Additionally, each of the wet etching and the dry etching is divided into a selective etching and a nonselective etching. The selective etching may enable only a single layer of a surface to be etched without affecting the other layers among multiple layers. The nonselective etching may enable multiple layers to be simultaneously etched including the other layers and the surface layer.

The selective etching in the wet etching may be performed using an etchant obtained by combining a few chemicals and is enabled to respond to only a predetermined material. The selective etching in the dry etching may be performed by injecting a reactive gas responding to only a predetermined material. The nonselective etching in the dry etching may include an Ion Beam Etching (IBE) performed by ion acceleration or a sputtering etching employing a magnetron. The selective etching may include Reactive Ion Etching (RIE) performed by ion acceleration and a reactive gas.

To etch the nanograting layer 120, both wet etching and dry etching may be used, and in particular, the selective etching may be used.

Hereinafter, a process of forming a pattern of a mask used in the etching is briefly described.

A pattern of a mask (not shown) may be formed by a lithography process.

The lithography process refers to a process of changing a mask using photons, electrons, or ions which pass through the mask, chemically processing the changed mask, and forming a desired pattern. The lithography process may be divided into three steps. First, a photosensitive polymer (namely, a resist) is uniformly applied to materials used to form a pattern. Subsequently, photons, electrons, or ions, passing through a mask engraved with a desired pattern are irradiated on a photosensitive film. Finally, chemical processing (developing) may be appropriately performed on a denatured photosensitive film, and accordingly the pattern may be formed.

Depending on circumstances, a more complex and sophisticated pattern of the mask may be formed by repeating the lithography process multiple times.

The nanograting layer 120 is etched using the mask 10 with the pattern, as shown in FIG. 4B. Here, the above-described dry etching or wet etching may be used.

Figure 4C:
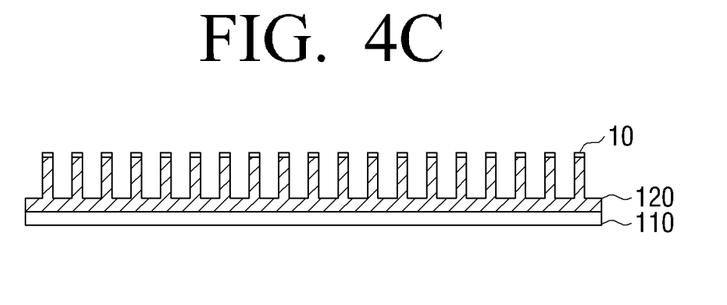

Subsequently, the mask 10 remaining on the etched nanograting layer 120 is removed, as shown in FIG. 4C. To remove the mask 10, organic solvents such as alcohols, glycols, ethers, esters, ketones, and the like, may be used.

Figure 4D:
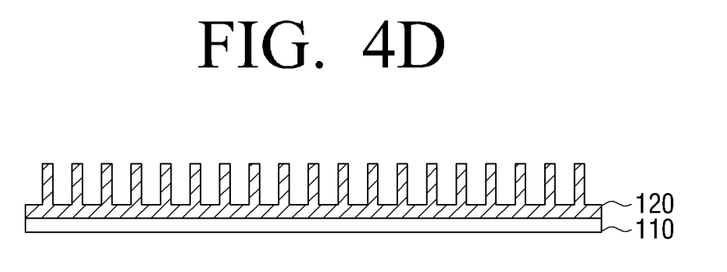

As shown in FIG. 4D, the nanograting layer 120 with the 3D nanostructures may be fabricated through the processes of FIGS. 4A through 4C.

Figure 5:
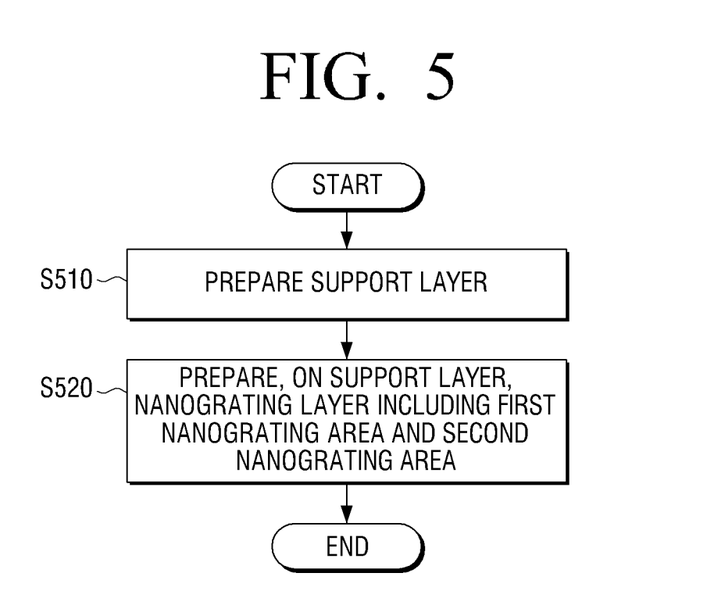
FIG. 5 is a flowchart illustrating a method for manufacturing a symbol on an exterior of an electronic device according to an exemplary embodiment.

FIG. 5 is a flowchart illustrating a method for manufacturing a symbol on an exterior of an electronic device according to an exemplary embodiment.

Referring to FIG. 5, in step S510, a support layer is prepared.

In step S520, a nanograting layer is prepared on the support layer. The nanograting layer may include a first nanograting area corresponding to a preset symbol, and a second nanograting area corresponding to an area other than the preset symbol. Each of the first nanograting area and the second nanograting area may include 3D nanostructures. A first pitch between the 3D nanostructures arranged in the first nanograting area may be different from a second pitch between the 3D nanostructures arranged in the second nanograting area. The first pitch may be greater than or less than the second pitch.

Specifically, since the first pitch and the second pitch are different from each other, an incident light may be emitted as light with different colors.

Here, the first nanograting area may include slit-shaped 3D nanostructures arranged at the first pitch and the second nanograting area may include slit-shaped 3D nanostructures arranged at the second pitch.

Alternatively, the first nanograting area may include bar-shaped 3D nanostructures arranged at the first pitch and the second nanograting area may include bar-shaped 3D nanostructures arranged at the second pitch.

The SPR phenomenon may be used in the nanograting layer. For example, if light between a visible spectrum and a near-infrared spectrum is incident on the nanograting layer, an electric field of the light may be coupled with a Plasmon so that a resonance phenomenon may occur.

Specifically, light absorption, except for a predetermined wavelength, may occur in the nanograting layer and accordingly vivid colors may be reflected. In this case, a greatly increased electric field may be formed locally, light energy may be converted into a plasmon, and accordingly the plasmon may be accumulated on a surface of nanoparticles of a metal. Thus, it is possible to use the Plasmon instead of conventional organic dyes.

As described above, according to exemplary embodiments, it is possible to manufacture a design or mark on an exterior of a home appliance, such as a television (TV), and an exterior of an information technology (IT) device, using characters, drawings, or colors, instead of using special printing or color printing.

Although a few exemplary embodiments have been shown and described, it would be appreciated by those skilled in the art that changes may be made in the exemplary embodiments without departing from the principles and spirit of the inventive concept, the scope of which is defined in the claims and their equivalents.

What is claimed is:

1. A method for manufacturing a symbol on an exterior of an electronic device, the method comprising:
    preparing a support layer; and
    preparing a nanograting layer on the support layer, the nanograting layer including a first nanograting area corresponding to a preset symbol and a second nanograting area corresponding to an area other than the preset symbol,
    wherein the first nanograting area includes three-dimensional (3D) nanostructures arranged a first pitch and the second nanograting area includes 3D nanostructures arranged at a second pitch,
    wherein the first nanograting area represents a first color corresponding to the first pitch and the second nanograting area represents a second color corresponding to the second pitch, and
    wherein the first and second colors are generated using a Surface Plasmon Resonance (SPR) phenomenon caused by the first and second pitches.

2. The method as claimed in claim 1, wherein the first nanograting area and the second nanograting area include slit-shaped 3D nanostructures.

3. The method as claimed in claim 1, wherein the first nanograting area and the second nanograting area include bar-shaped 3D nanostructures.

4. The method as claimed in claim 1, wherein the preparing the nanograting layer on the support layer includes laminating the nanograting layer on the support layer.

5. The method as claimed in claim 4, wherein the preparing the nanograting layer on the support layer includes covering the nanograting layer with a mask in order to etch the nanograting layer to form the 3D nanostructures.

6. The method as claimed in claim 5, wherein the preparing the nanograting layer on the support layer further includes using wet etching or dry etching.

7. A method for manufacturing a symbol on an exterior of an electronic device, the method comprising:
   preparing a support layer; and
   preparing a nanograting layer on the support layer,
   wherein the nanograting layer includes a first area including first grooves arranged at first intervals and a second area including second grooves arranged at second intervals,
   wherein the first and the second areas respectively generate a first color and a second color through a Surface Plasmon Resonance (SPR) phenomenon.

* * * * *